United States Patent
Ohlig et al.

[19]

[11] Patent Number: 6,151,792
[45] Date of Patent: Nov. 28, 2000

[54] REGISTRATION SYSTEM AND METHOD

[75] Inventors: Albert H. Ohlig, Newport Beach; Todd W. Lansinger, Laguna Miguel, both of Calif.

[73] Assignee: Olec Corporation, Irvine, Calif.

[21] Appl. No.: 08/811,623

[22] Filed: Mar. 5, 1997

[51] Int. Cl.⁷ .................................................. B65G 47/24
[52] U.S. Cl. ............................... 33/613; 33/645; 269/47; 269/903; 248/309.2
[58] Field of Search ............................. 33/614, 613, 533, 33/549, 623, 644, 645; 269/903, 47, 53, 303; 101/DIG. 36; 211/41.17; 248/309

[56] References Cited

U.S. PATENT DOCUMENTS

| | | | |
|---|---|---|---|
| 4,593,804 | 6/1986 | Kinsey et al. | 269/303 |
| 4,875,966 | 10/1989 | Perko | 269/903 |
| 4,969,275 | 11/1990 | Hesseltine | 33/549 |
| 5,246,218 | 9/1993 | Yap et al. | 269/903 |
| 5,248,869 | 9/1993 | DeBell et al. | 269/47 |
| 5,566,840 | 10/1996 | Waldner et al. | 269/903 |
| 5,722,648 | 3/1998 | Groll et al. | 269/47 |
| 5,799,408 | 9/1998 | Sprayberry | 33/533 |

FOREIGN PATENT DOCUMENTS 2192719  1/1988  United Kingdom ..................... 33/533

*Primary Examiner*—Andrew H. Hirshfeld
*Attorney, Agent, or Firm*—Fenwick & West LLP

[57] ABSTRACT

Registration system and method provide for alignment of films with circuit panels. The exact position of tooling holes in the panel are found using tapered pins. After the exact position of the tooling holes are found tapered registration pins are inserted into the tooling holes. The top of the registration pin is narrower than the tooling hole so that the pin will easily slide into the tooling hole. The middle part of the registration pin is substantially the same size as the tooling hole, thereby ensuring a snug fit between the tooling hole and the registration pin. Where a tooling hole is comprised of overlapping holes, the registration pin contacts several of these holes. A loading apparatus provides pneumatic pressure beneath the registration pin to push the registration pin into the tooling hole. After the registration pins are placed in the tooling holes of the panel, a film is placed on the panel such that the registration pins are inserted into the holes of the film.

1 Claim, 9 Drawing Sheets

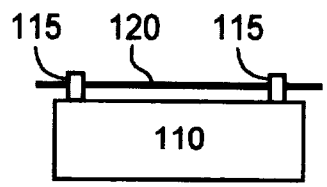
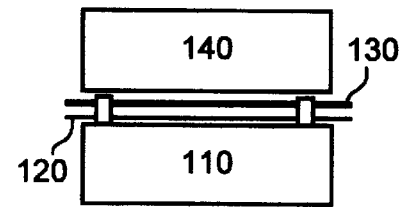
Figure 1a     Figure 1b
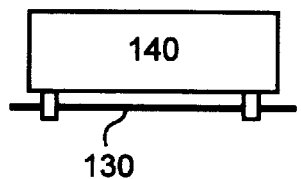
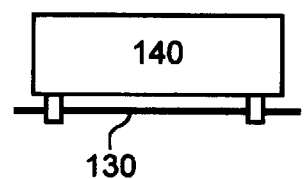
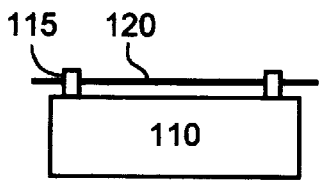
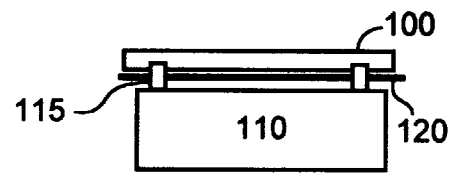
Figure 1c     Figure 1d
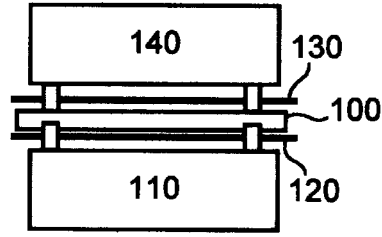
Figure 1e
Prior Art

Drill Sequence

Pin Fully Extended

Pin at Normal Operating Position 800

Pin Fully Retracted

REGISTRATION SYSTEM AND METHOD

FIELD OF THE INVENTION

The present invention relates to the field of printed circuit boards, and, more specifically to a system and method for registering films to drilled holes in the printed circuit board.

BACKGROUND OF THE INVENTION

FIGS. 1a–1e illustrate a conventional method for making a printed circuit board. As illustrated in FIG. 1a, a lower film 120 having a circuit pattern is placed on a lower support plate 110, such as a glass platen, having registration pins 115. The lower film has holes corresponding to the registration pins 115, and the registration pins 115 are inserted into the holes of the lower film 120. As illustrated in FIG. 1b, an upper film 130 is then placed on top of the lower film 120. The upper film 130 also has holes corresponding to the registration pins 115, and the registration pins are inserted into the holes of the upper film 130. Next an upper support plate 140, such as a glass platen, is placed on top of the upper film 130. Vacuum is then drawn between the lower support plate 110 and the lower film 120 and between the upper support plate 140 and the upper film 130. As a result, the lower film 120 is pressed against the lower support plate 110 and the upper film 130 is pressed against the upper support plate 140. The upper film 130 and the upper support plate 140 are then pulled away from the lower film 120 and the lower support plate 110 (FIG. 1c). A copper-clad circuit panel 100 coated with photosensitive material is then placed on top of the lower film 120 (FIG. 1d), and the upper film 130 and the upper support plate 140 are pushed down against the panel (FIG. 1e).

To create the printed circuit board, the upper and lower films 120, 130 are exposed to light, causing the photosensitive coating on both sides of the panel 100 to be chemically altered. After further processing, select portions of the copper on the panel 100 are etched away in accordance with the circuit patterns on the films 120, 130. This creates a circuit pattern on the upper and lower sides of the panel 100, one pattern corresponding to the lower film 120 and the other pattern corresponding to the upper film 130.

Before the upper and lower films 120, 130 are placed against the panel 100, holes, referred to as circuit holes, are drilled into the panel 100. FIG. 2 illustrates one such circuit hole 210. Ideally, the outer perimeter of the circuit hole 210 is surrounded by a ring of copper, known as the annular ring 220. Copper paths, known as "traces" 230 couple circuit hole 210 to other circuit holes in the panel 100. Because the circuit holes 210 are coupled by copper traces 230, electric signals can travel between the circuit holes 210 and to and from any circuit paths soldered to the traces 230 or the annular rings 220. Circuit paths are often coupled together via the annular rings 220 or the traces 230. Additionally, because many printed circuit boards have several layers of circuitry, wires are often soldered to the annular ring 220 to couple the different layers of circuitry.

The annular rings 220 and the traces 230 are part of the circuit pattern created when the films 120, 130 are exposed to light. Thus, it is important that the upper and lower films 120, 130 be properly positioned with respect to the circuit holes 210 so that the annular rings 220 and the traces 230 match up with the circuit holes 210. The likelihood of an annular ring 220 completely surrounding a circuit hole 210 is known as the annular ring 220 tolerance. As circuit densities increase, it become more important that the annular ring 220 tolerance increases.

One method for increasing annular ring 220 tolerance is to decrease the size of the circuit holes 210. This increases annular ring 220 tolerance because the smaller a circuit hole 210, the greater the likelihood that the circuit hole 210 will be completely surrounded by an annular ring 220. A disadvantage of this method is that smaller drill bits are used to drill smaller holes, and smaller drill bits tend to bend during the drilling process, resulting in inaccurate positioning of the circuit holes 210. Additionally smaller drill bits cannot drill through many panels 100. The drilling process is slow and expensive, and, thus it is advantageous to drill through as many panels 100 at one time as possible. Therefore, it is desirable to have a system and method that increases annular ring tolerance without reducing circuit hole 210 size.

SUMMARY OF THE INVENTION

The present invention provides a system and method for registering films to drilled holes on a panel of a printed circuit board. The panel includes tooling holes that are used to align the films to the panel. The position of tooling holes can vary, and the present invention uses a tapered pin to determine the exact position of the tooling holes. After the exact position of the tooling holes is determined, the panel is transferred to a substantially flat surface, such as a glass platen, having registration pins. The registration pins, which are tapered twice, are placed in the tooling holes. The first taper, at the top of the registration pin, is the narrowest so that the registration pin can easily fit into a tooling hole. The second taper, in the middle pin, is substantially the same width as the tooling hole so that the registration pin snugly fits into the tooling hole. In one embodiment, the registration pin is pushed up into the tooling hole using pneumatic pressure.

A tooling hole may comprise many overlapping holes, known as drill hits. In one embodiment of the invention, the registration pin is placed in the tooling hole such that the registration pin contacts several of the drill hits.

BRIEF DESCRIPTION OF THE DRAWINGS

FIGS. 1a–1e illustrate a conventional method for making a printed circuit board.

DETAILED DESCRIPTION OF THE PREFERRED EMBODIMENT

Figure 2:
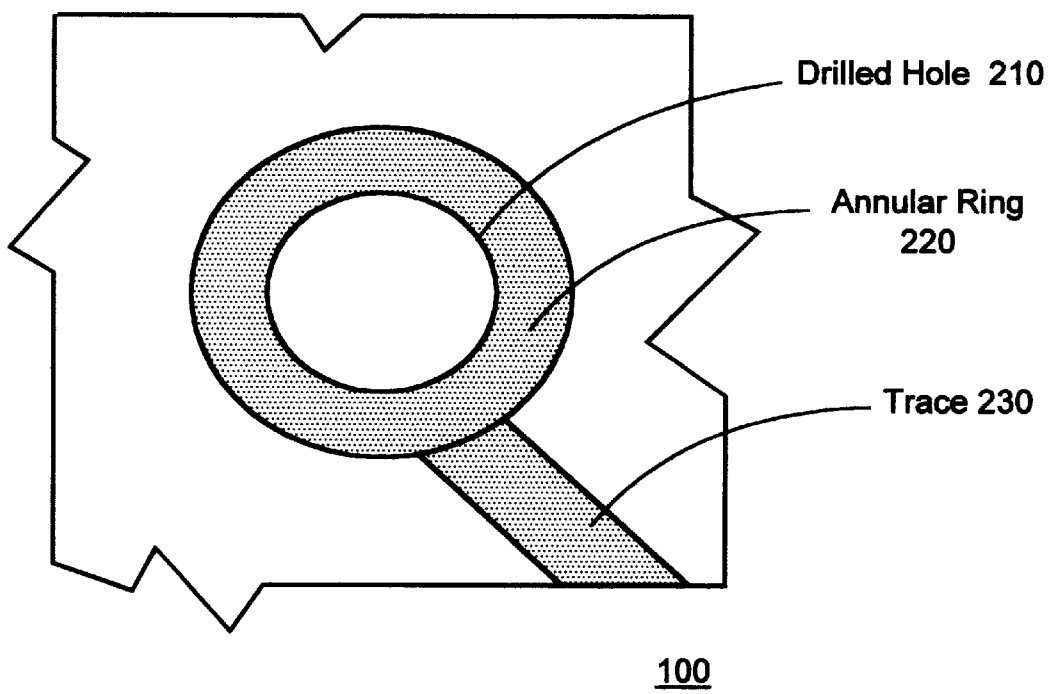
FIG. 2 illustrates a circuit hole in a panel of a convention printed circuit board.
Figure 3:
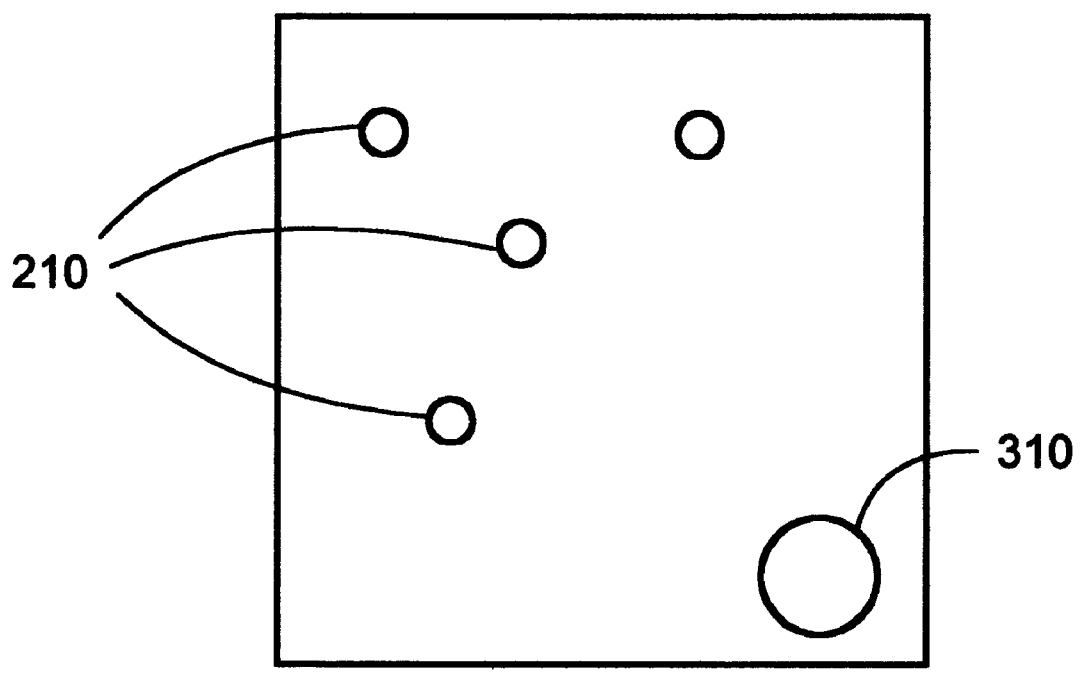
FIG. 3 illustrates a panel having circuit holes and tooling holes.

FIG. 3 illustrates a panel 100 having circuit holes 210. Each panel 100 has at least one tooling hole 310 which is drilled into the panel 100 at the same time as the circuit hole 210. In one embodiment, each panel 100 has three tooling holes 310. In one embodiment, the tooling holes 310 are not perfectly circular, but are oblong and look like slots. The tooling holes 310 are used to align the upper and lower films 120, 130 with the circuit holes 210 in the panel 100. In other words, the position of the tooling holes 310 dictates the position of the upper and lower films on the panel 100. More specifically, the position of the tooling holes 310 affects the alignment of the annular ring patterns on the films 120, 130 relative to the circuit holes 210.

The amount of distance from the tooling hole 310 to the edge of the panel 100 varies. The first step in attempting to properly align the panel 100 with the films 120, 130 is to reliably find the exact position of the tooling holes 310 without imposing tight production tolerances on panel dimension and tooling hole 310 locations. Imposing tight production tolerances increases the expense of making the panels 100.

Figure 4:
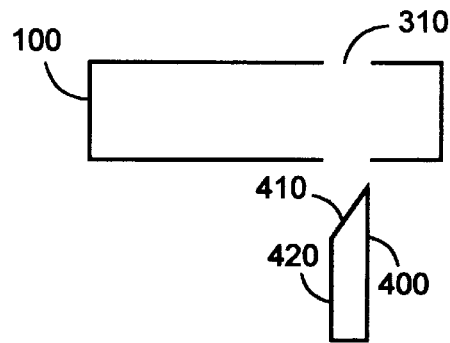
FIG. 4 illustrates a tapered pin positioned below a tooling hole of a panel.

A tooling hole 310 can be reasonably expected to be within a certain area. Referring to FIG. 4, a tapered pin 400 is placed beneath this area. The diameter of the tip 410 of the tapered pin 400 is significantly smaller than the diameter of the tooling hole 310. For instance, the width of the tooling hole 310 may be 0.187 inches and the diameter (width) of the tip of the tapered pin 400 may be 0.007 inches. To establish the exact location of the tooling hole 310, the tapered pin 400 is pushed up toward the tooling hole 310. Since the tip 410 is so small relative to the size of the tooling hole 310, the likelihood of the tip 410 being pushed into the tooling hole 310 is high, even though the location of tooling holes 310 may vary significantly. For instance, if the width of the tooling hole is 0.187 inches and the diameter of the tip of the tapered pin is 0.007 inches, then the tooling hole may deviate as much as 0.09 inches from the location in which it is supposed to be and the tapered pin will still be pushed into the tooling hole. After the tip 410 is pushed through the tooling hole 310, a wider end 420 of the tapered pin 400 is pushed through the tooling hole 310. Since the diameter of the wide end 420 of the tapered pin 400 is substantially equal to the diameter of the tooling hole 310, the exact location of the tooling hole 310 is known. Specifically, the tooling hole 310 is in substantially the same position as the wide end 420 of the tapered pin 400.

Figure 5A:
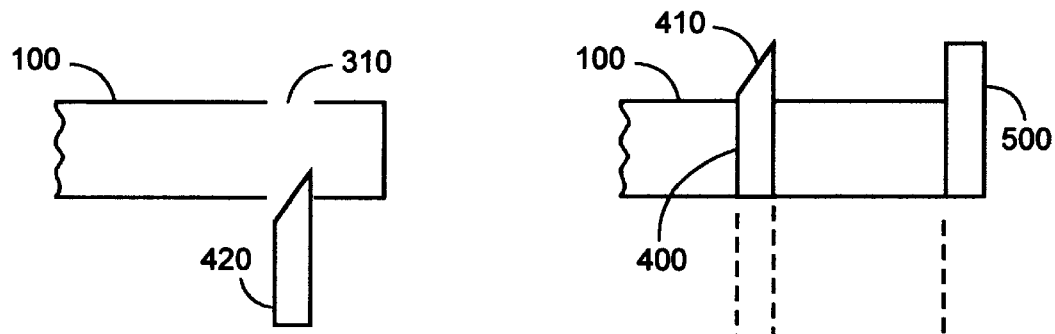
FIGS. 5a–5c illustrate the tapered pin being pushed through the tooling holes of three different panels.
Figure 5B:
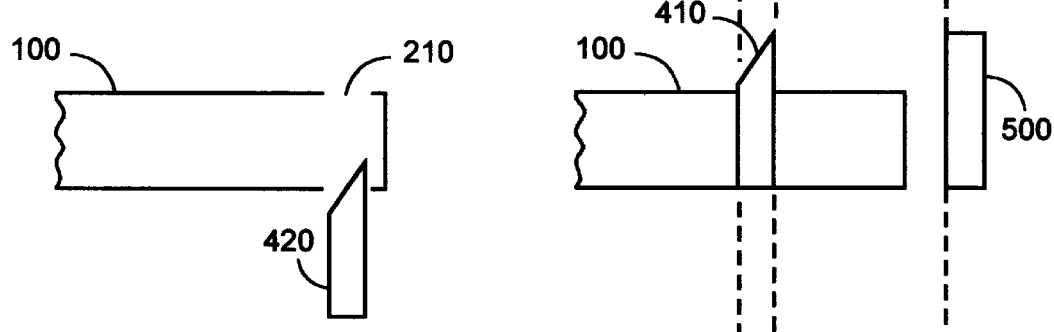
Figure 5C:
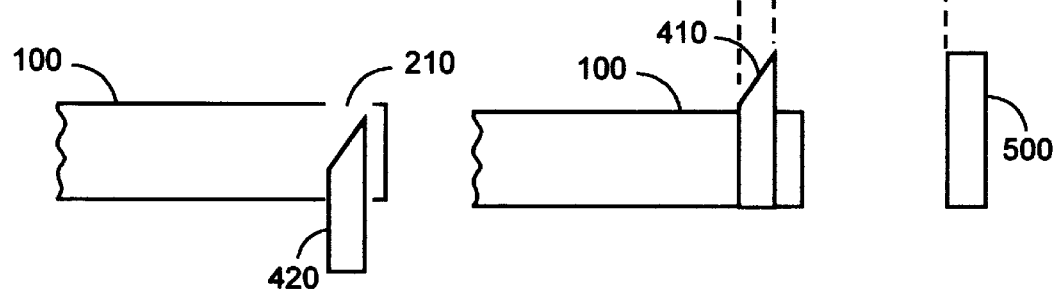

FIGS. 5a–c illustrate the tapered pin 400 being pushed through the tooling holes 210 of three different panels 100. The tooling hole 310 displayed in FIG. 5a is farther away from the edge of the panel 100 than the tooling hole 310 displayed in FIG. 5b. Similarly, the tooling hole 310 displayed in FIG. 5b is father away from the edge of the panel 100 than the tooling hole 310 displayed in FIG. 5c. Note that, despite the fact that distance between the tooling hole 310 and the edge of the panel 100 varies between the panels 100 displayed in FIGS. 5a–c, once the wide end 420 of the tapered pin 400 is inserted into the tooling holes 310, all three tooling holes 310 are in the exact same position with respect to a fixed point, such as a stop bar 500. Thus, the exact position of the tooling holes 310 can be determined, even though different panels 100 will not have tooling holes 310 in the exact same position.

The tapered pin 400 is tapered on one side and straight on the opposite side. The effect of this is that when the tapered pin 400 is pushed up through the tooling hole 310, the panel 100 is pushed away from the stop bar 500. Thus, in a single motion the tapered pin 400 properly positions the tooling hole 310 and pushes the panel 100 away from the stop bar 500. The panel 100 can be damaged if it is pressing against the stop bar 500.

Figure 6:
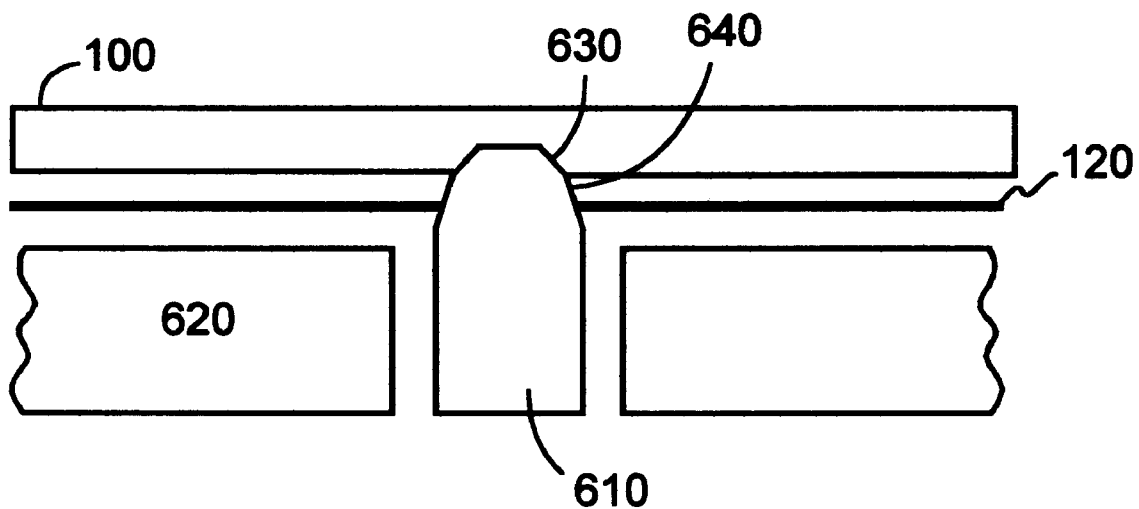
FIG. 6 illustrates a registration system having a registration pin mounted on a substantially flat surface.

Once the exact position of the tooling holes 310 are known, the panel 100 can be accurately and repeatedly transported to registration pins mounted on a support plate. FIG. 6 illustrates a registration system 600 having a registration pin 610 mounted on a support plate 620, such as a glass platen. As discussed above with respect to FIG. 1, the lower film 120 lies on top of the support plate 620 and the panel is placed above the lower film 120. To register the panel 100 with respect to the support plate 620, the registration pin 610 is inserted into the tooling hole 310. In conventional registration systems, there must be a clearance between the registration pin and the tooling hole 310. The purpose of the clearance is to ensure that the tooling hole 310 will fit on the pin, but the clearance reduces the accuracy at which the panel 100 can be positioned.

As illustrated in FIG. 6, the present invention uses a dual tapered registration pin 610 to ensure that the registration pins will fit in the tooling holes 210 without the need for a clearance. The most tapered end 630 of the registration pin is smaller than the tooling hole 310, and the middle tapered section 640 is substantially the same size as the tooling hole 310. The small size of most tapered end 630 ensures that the registration pin 610 will initially fit into the tooling hole 310. Once the most tapered end 630 is in the tooling hole 310 the middle tapered section 640 is pushed in, thereby creating a snug fit between the registration pin 610 and the tooling hole 310. The amount of force by which the registration pin 610 is inserted in the panel 100 depends on the panel 100 weight and strength. The stronger and heavier the panel, the more force is used to insert the registration pin 610 into the panel.

Although, FIG. 6 illustrates only one registration pin, several registration pins may be inserted into one panel. In one embodiment of the invention, three registration pins are inserted into each panel 100.

In one embodiment, pneumatic pressure is used to force the wide end to the registration pin 610 into the tooling hole 310. The apparatus for applying the pneumatic pressure will be discussed in further detail below.

Figure 7:
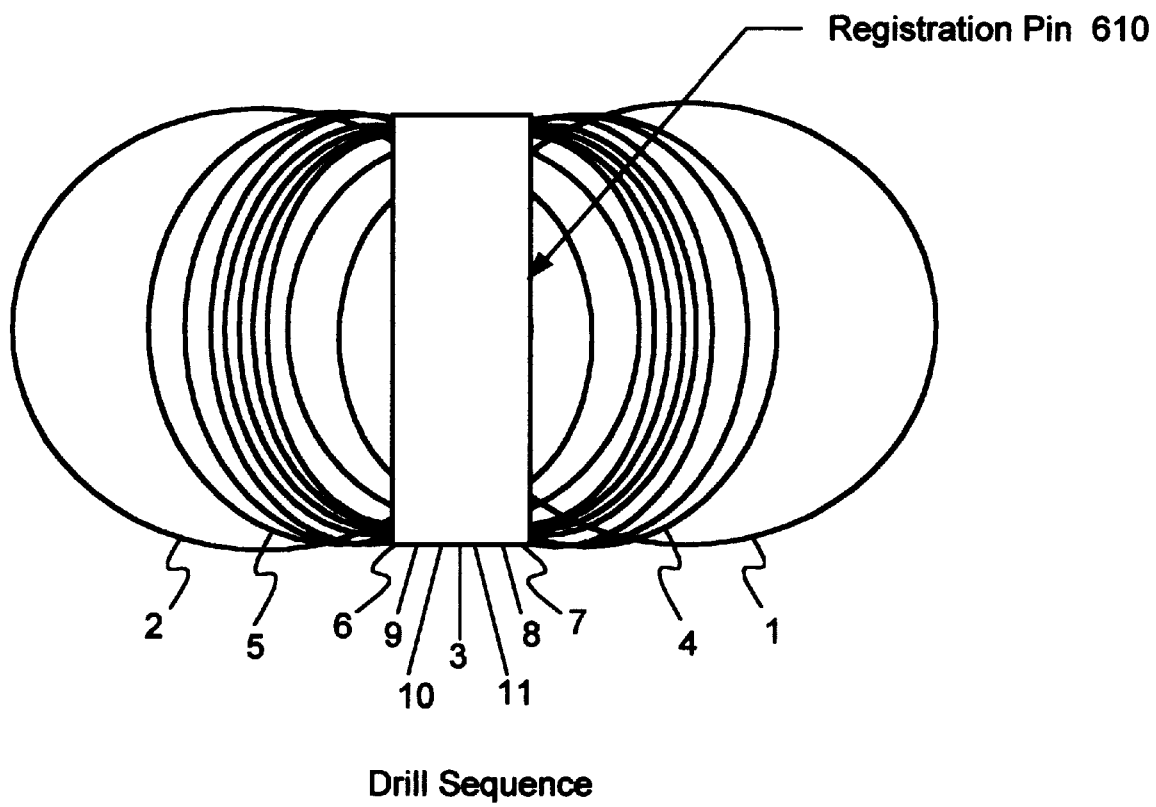
FIG. 7 illustrates an example of a tooling hole comprised of overlapping holes.

Sometimes when a tooling hole 310 is being drilled in a panel 100, many overlapping holes are drilled because of inaccuracies in the drilling process. In other words, a tooling hole 310 may comprise of several overlapping holes, referred to as "drill hits." FIG. 7, illustrates an example of a tooling hole 310 comprised of drill hits. In FIG. 7, the tooling hole 310 comprises 11 different, overlapping holes or drill hits. In conventional registration systems, the registration pin is placed in the center most drill hit, which would be hole # 3 in FIG. 7. However, statistical studies show that annular ring 220 tolerance is improved and varies less if the registration pin 610 contacts several of the drill hits and is placed in a median position for a number of the drill hits. Thus, in one embodiment of the present invention the wide end of registration pin 610 is placed in the tooling hole 310 such that it contacts several drill hits and occupies a median position with respect to the positions of all the drill hits. For instance, in the example of FIG. 7, the wide end of the registration pin 610 would be wide enough and positioned to come into contact with 7 of the 11 holes. In an alternate embodiment, the tooling hole 310 occupies a mean position with respect to the positions all the drill hits.

Once the registration pins 610 are inserted into the panel 100, the upper film 130 is placed on the panel 100. The upper film has holes corresponding to the registration pins 610, and the registration pins 610 are put through the holes to properly align the upper film with the circuit holes 210 in the panel 100. In an alternate embodiment, the films are placed on different registration pins than the panel 100.

Figure 8:
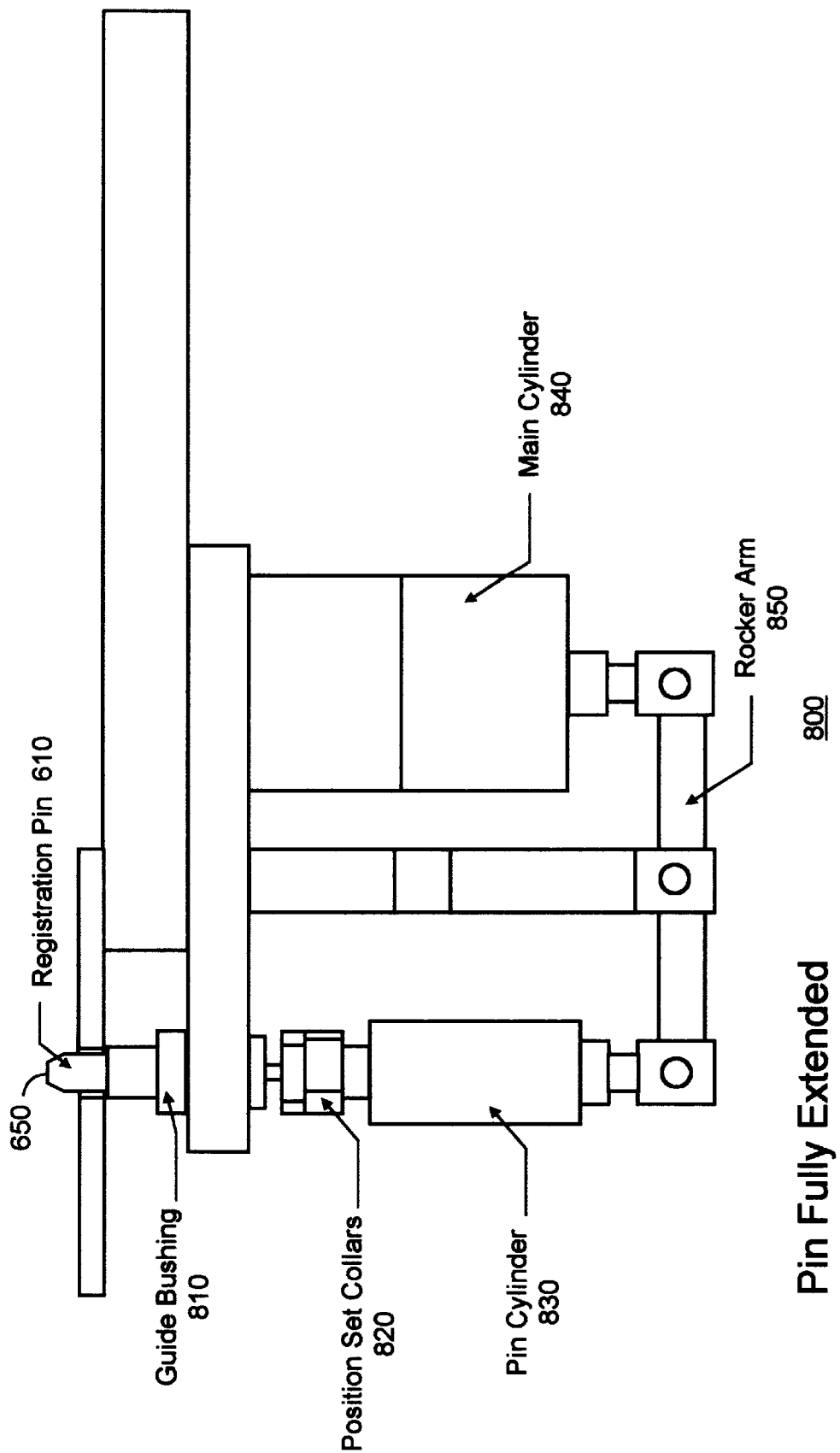
FIGS. 8–10 illustrates a registration pin actuation mechanism.

FIG. 8 illustrates a registration pin actuation mechanism 800. The pin actuation mechanism 800 comprises a guide bushing 810, a position set collars 820, a pin cylinder 830, a main cylinder 840, and rocker arm 850. The pin actuation mechanism 800 moves the registration pin up and down in a vertical motion. When the upper and lower films 120, 130 are being placed on the support plate 620, the registration pin 610 is in the highest position. This exposes the flat surface 650 of the registration pin so as to accept the lower and upper films 120, 130 in register.

FIG. 8 illustrates the registration pin 610 raised to its highest position. To raise the registration pin 610 to its highest position, the main cylinder 840, which is a conventional cylinder, is extended. This causes the rocking arm 850 to move the pin cylinder 830 toward the registration pin 610, thereby lifting up the registration pin 610. The pin cylinder 830 is a conventional cylinder. When the registration pin 610 is in the highest position, both the main cylinder 840 and the pin cylinder 830 are extended. The guide bushing 810 guides the movement of the registration pin 610 to ensure accurate positioning of the pin 610. The positional set collars 820 set the extent of the pin 610 movement and ensure that the pin moves a predetermined amount.

Figure 9:
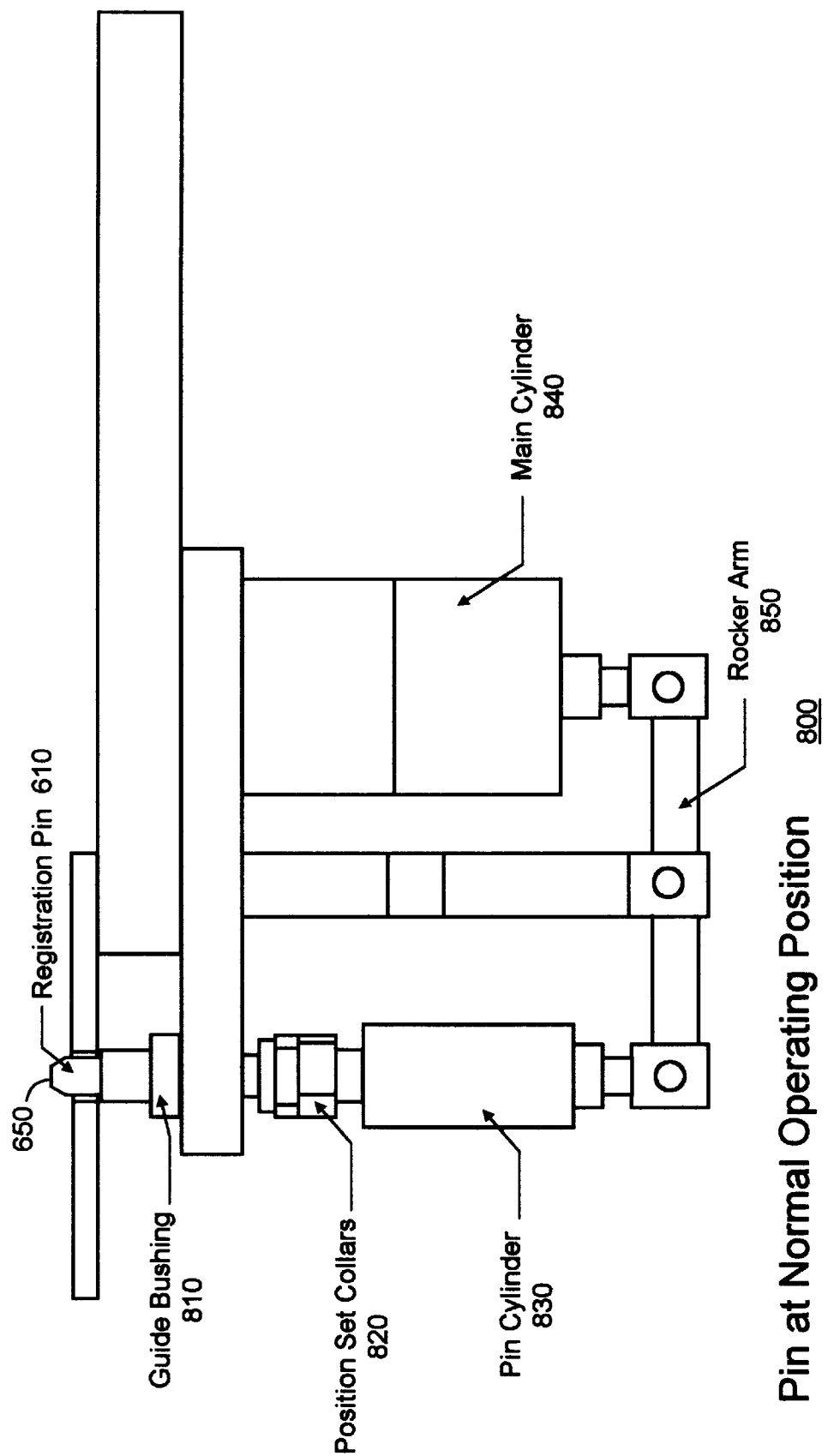

FIG. 9 illustrates the registration pin 610 in the middle position, which is the normal operating position. This is the position the registration pin 610 is in when it receives a panel 100. To achieve this middle position, the main cylinder 840 extends, causing the rocking arm 850 reposition the pin cylinder 830 upward. The pin cylinder 830 is retracted, causing the registration pin 610 to be in the middle position. Once the upper support plate 140 is placed on the upper film 130, the upward force on the pin is set pneumatically with an air pressure regulator to a force suitable to position the panel without deforming tooling holes 310.

Figure 10:
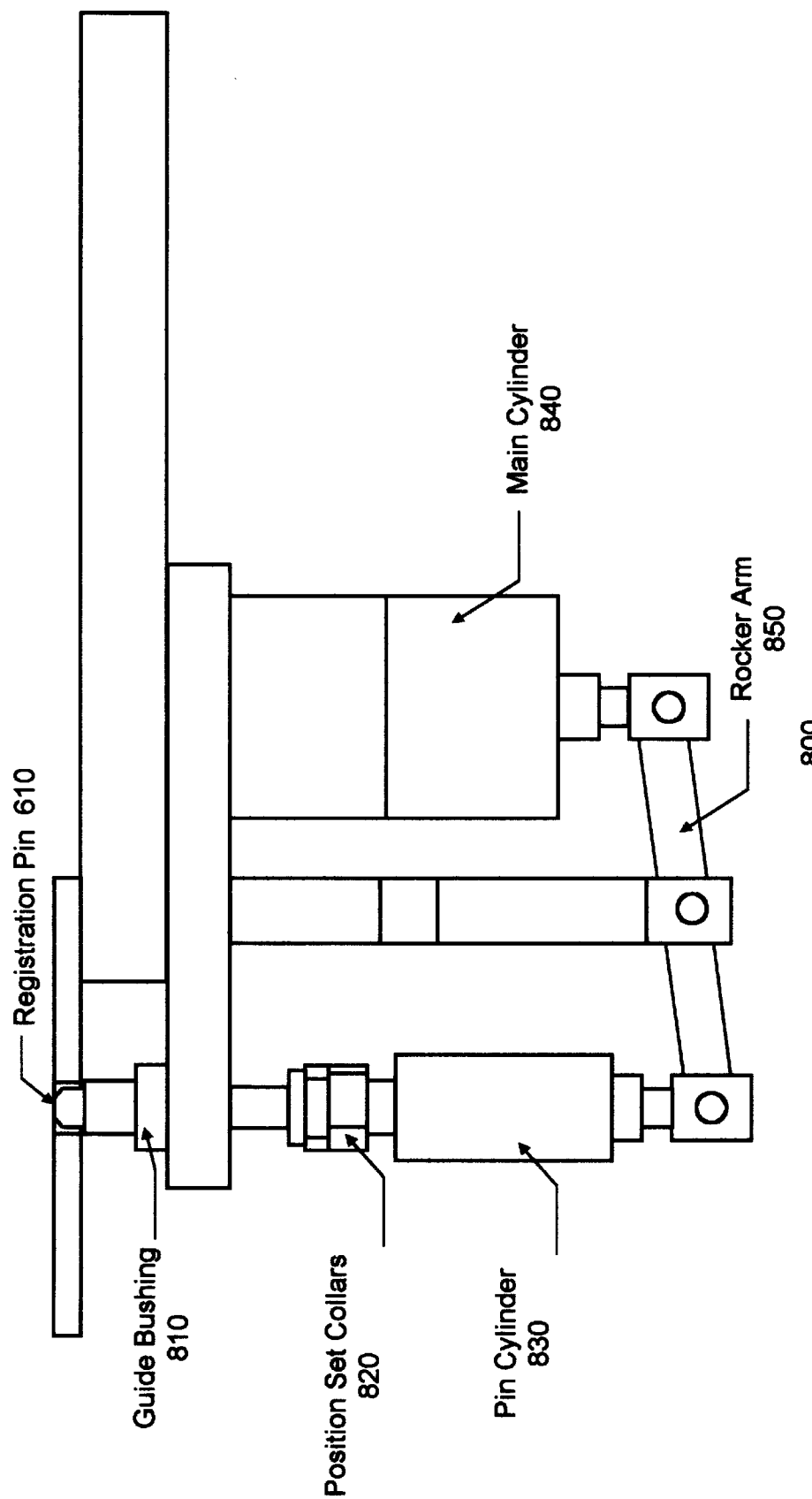

After the exposure of the films 120, 130 is complete, the registration pin is lowered to its lowest position, which is illustrated in FIG. 10. To achieve this position, the main cylinder 840 and the pin cylinder 820 are completely retracted. Placing the registration pin in its lowest position allows the panel 100 to be removed from the registration system 600 without the potential for binding.

In an alternate embodiment, the pin actuation mechanism 800 does not include the rocker arm 850. Instead, the pin cylinder 830 and the main cylinder 840 are connected directly in series (in line).

What is claimed is:

1. A method for inserting a registration pin in a tooling hole of a panel of a printed circuit board, the tooling hole formed from a plurality of overlapping, substantially circular drilled holes, the method comprising:

placing the panel over a registration system having a dual tapered registration pin, wherein the dual tapered registration pin comprises a first tapered section at an upper end thereof, a second tapered section at a middle thereof, and a rectangular section beneath the second tapered section;

inserting the first tapered section of the dual tapered registration pin into the tooling hole;

inserting the second tapered section of the dual tapered registration pin into the tooling hole;

inserting the rectangular section of the dual tapered registration pin into the tooling hole such that the rectangular section comes into contact with several of the overlapping drilled holes.

* * * * *